United States Patent [19]

Kawaguchi et al.

[11] Patent Number: 5,084,211

[45] Date of Patent: Jan. 28, 1992

[54] ANISOTROPICALLY ELECTROCONDUCTIVE ADHESIVE

[75] Inventors: Toshiyuki Kawaguchi, Tokyo; Kazuya Tanaka, Saitama, both of Japan

[73] Assignee: Shin-Etsu Polymer Co., Ltd., Tokyo, Japan

[21] Appl. No.: 362,486

[22] Filed: Jun. 7, 1989

[51] Int. Cl.$^5$ .............................................. H01B 1/06
[52] U.S. Cl. .................... 252/511; 524/495; 524/496; 523/468
[58] Field of Search ............... 252/511; 524/495, 496; 523/468

Primary Examiner—Josephine Barr
Attorney, Agent, or Firm—McAulay Fisher Nissen Goldberg & Kiel

[57] ABSTRACT

An anisotropically electroconductive adhesive composition preferably in the form of a film is proposed which comprises an insulating adhesive resin and preferably 0.1 to 30 parts by volume of amorphous carbon particles having a spherical particle configuration per 100 parts by volume of the resin. The amorphous carbon particles are prepared by carbonization of spherical particles of a heat-curable plastic resin and should have an average diameter of 5 to 50 $\mu$m, specific gravity of 1.4 to 1.7, coefficient of linear thermal expansion of 2 to $5 \times 10^{-6}/°$ C. and, preferably, sphericity not exceeding 5 $\mu$m. The amorphous carbon particles are chemically and mechanically stable so that the inventive adhesive composition can ensure high stability in the electrical connection between electrodes bonded therewith and insulation between adjacent electrodes.

6 Claims, No Drawings

ANISOTROPICALLY ELECTROCONDUCTIVE ADHESIVE

BACKGROUND OF THE INVENTION

The present invention relates to an anisotropically electroconductive adhesive composition or, more particularly, to an anisotropically electroconductive adhesive composition which serves to electrically connect a pair of terminal electrodes on two circuit boards or, one, on a circuit board and, the other, on an electronic component with simultaneous adhesive bonding of the two circuit boards or the circuit board and electronic component by being interposed therebetween followed by heating under pressure.

It is well known that an insulating adhesive composition compounded with an electrically conductive particulate or fibrous material dispersed therein exhibits anisotropic electroconductivity. Furthermore, it is also well known that the anisotropically electroconductive adhesive compositions of this type are satisfactorily used for connecting integrated circuits, various kinds of display units and other electronic components with a circuit board for driving the electrical component. Various kinds of electrically conductive particulate and fibrous materials are known and used as a component of such an anisotripically electroconductive adhesive composition in the prior art including particles of a metal such as gold, silver, nickel, aluminum, iron and the like as taught in Japanese Patent Publication 58-56996, particles of a metal or plastic having a plating layer of a noble metal and the like on the surface thereof as taught in Japanese Patent Kokai 51-135938, carbon black as taught in Japanese Patent Publication 60-52187, graphite powders as taught in Japanese Patent Publication 61-9342, carbon fibers or ceramics as taught in Japanese Patent Publication 59-64685 and so on.

However, each of these known conductive particulate and fibrous materials has its own disadvantages and problems. For example, metal particles are chemically unstable so that an increase in the contact resistance in the lapse of time is unavoidable eventually leading to disconnection in the circuit during long term use by the oxidation or sulfidization due to contacting with moisture or polluted air penetrating along the boundaries with the insulating adhesive resin enveloping the particles or the interface between the bonded substrate and the adhesive. Particulate materials plated with a noble metal are chemically stable to be freed from the above mentioned drawbacks but they are industrially not fully practical due to the outstanding expensiveness. Carbon blacks, carbon fibers, graphite powders and ceramic powders are also chemically stable. However, it is substantially impossible to establish electric connection between a pair of electrodes through particles of carbon black having an extremely fine particle size as small as 3 nm or even smaller. Carbon fibers cannot be used as a dispersed phase in a conductive adhesive composition to connect circuit boards bearing electrode terminals of 0.6 mm or smaller in size due to the leak by the fibers having a length to bridge between adjacent electrodes despite the sufficiently small diameter of around 5 to 15 $\mu$m. Graphite particles cannot be suitably used as a conductive material because of their brittleness as is evidenced by their compression strength as low as 300 to 1000 kg/cm$^2$ to be eventually crushed or smashed by the influences of heat or compressive force in the course of the bonding works.

The conductive particulate materials prepared by providing a plating layer of a noble metal on the particles of a metallic powder or microspheres of a ceramic, such as inorganic glass, alumina and the like, or a plastic have various disadvantages such as pinholes usually found in the plating layer and crushing of the particles or exfoliation of the plating layer by the mechanical stress which the particles receive in the course of compounding or adhesive bonding works eventually leading to failure in the electric connection or short-circuiting between adjacent terminals.

Ceramic powders, though chemically stable, are also not free from some disadvantages including the usually low electrical conductivity with a specific resistance of as high as $10^{-2}$ ohm.cm or higher and abrasiveness against the surface of the substrate, such as a transparent electrode, bonded with the adhesive to cause cloudiness.

The configuration of the conductive particles used in the prior art is diversified and includes many types such as spherical particles, granular particles, dendritic particles, flaky particles, acicular particles, polyhedral particles, spongy particles, irregularly shaped particles and the like. Among these varieties, however, those having an isotropic configuration are preferred in consideration of the stability in contacting and easiness of screening to obtain uniformity in the particle size distribution and, more particularly, spherical particles are the most suitable in an additional consideration of the relationship between the film thickness and the particle size. Though highly preferable, conductive powders of spherical particles available on the market are limited to the powders of metals such as silver, copper, copper-tin alloys, solder alloys and the like and metal-plated particles of non-conductive substances such as inorganic glass, alumina and plastics including epoxy resins and polystyrene resins. These spherical particles having conductivity are accompanied by chemical and mechanical instability as mentioned before to cause poor electrical connection.

In addition, it is difficult to obtain a conductive adhesive composition containing a metal or ceramic powder as the conductivity-imparting uniformly dispersed phase in a matrix of an insulating adhesive resin due to eventual settling of the powder in the adhesive resin to cause uneven distribution of the particles in the matrix as a consequence of the relatively large specific gravity thereof. In particular, drawbacks of failure in electrical connection or leakage of current sometimes take place, especially, when the arrangement pitch of the electrode terminals is, for example, 0.4 mm or smaller.

SUMMARY OF THE INVENTION

In view of the various disadvantages in the conductive adhesive compositions in the prior art as mentioned above, the present invention has been completed to obtain an anisotropically electroconductive adhesive freed from the above mentioned problems and disadvantages in the prior art. The anisotropically electroconductive adhesive composition of the invention comprises an insulating adhesive resin as a matrix and amorphous carbon particles having a spherical configuration, average diameter in the range from 5 to 50 $\mu$m, specific gravity in the range from 1.4 to 1.7 and coefficient of linear thermal expansion in the range from $2 \times 10^{-6}$ to $5 \times 10^{-6}$/°C. prepared by the calcination and carbonization of spherical particles of a heat-curable plastic resin, and dispersed in the matrix resin.

The insulating adhesive resin should preferably have a specific gravity of 0.8 or larger before curing.

DETAILED DESCRIPTION OF THE PREFERRED EMBODIMENTS

The present invention relates to an anisotropically electroconductive adhesive composition freed from the above mentioned problems. The anisotropically electroconductive adhesive composition of the invention comprises an insulating adhesive resin and amorphous carbon particles having a spherical configuration, average diameter in the range from 5 to 50 $\mu$m, specific gravity in the range from 1.4 to 1.7 and coefficient of linear thermal expansion in the range from $2\times10^{-6}$ to $5\times10^{-6}$/°C. as prepared by the calcination and carbonization of spherical particles of a heat-curable plastic resin, which are compounded with and dispersed in the insulating adhesive resin.

Namely, the inventors have conducted extensive studies in order to develop an anisotropically electroconductive adhesive composition having chemical stability, stability of the adhesive bonding strength and reliability electrical connection with little problems of current leakage. As a result, the inventors have arrived at a discovery that amorphous carbon particles having a spherical particles configuration prepared by the calcination and carbonization of spherical particles of a heat-curable plastic resin are satisfactorily used in the conductive adhesives by compounding with and dispersing in an insulating adhesive resin since such carbon particles have chemical stability and would not be crushed or smashed by receiving a mechanical compressive force during the bonding works or in the course of the mixing process with the insulating adhesive resin as a consequence of the small average particle diameter in the range from 5 to 50 $\mu$m, specific gravity in the range from 1.4 to 1.7 and coefficient of linear thermal expansion in the range from $2\times10^{-6}$ to $5\times10^{-6}$/°C. and also are free from the problem of eventual settling in the insulating adhesive resin owing to the small specific gravity in the range from 1.4 to 1.7. Furthermore, good durability of the adhesive bonding strength can be obtained due to the spherical particle configuration thereof with a small average particle diameter in the range from 5 to 50 $\mu$m. The inventors have completed the present invention after conducting extensive studies relative to the type of the insulating adhesive resin used as the matrix, kind of the heat-curable plastic resin as the starting material of the electrically conductive particles, conditions of carbonization and so on based on the above mentioned discovery.

The term of an "average particle diameter" implied in this specification means the "median diameter" indirectly obtained by calculating from the profile of the distribution function which can be obtained by the measurement with a measuring instrument for particle size distribution in which the method of light transmission is applied to a dispersion which contains particles under settling according to the liquid-phase sedimentation method. Various types of such instruments are available including a model of Shimadzu Centrifugal Sedimentation Particle Size Analyzer.

Detailed description of the inventive adhesive composition is given in the following.

The insulating adhesive resin as the matrix component of the inventive anisotropically electroconductive adhesive composition is not particularly limitative and can be selected from various polymeric substances of either a thermoplastic or a heat-curable type used in conventional adhesives. Examples of such polymeric substances include polystyrenes, ethylene-vinyl acetate copolymers, ethylene-acrylic acid copolymers, polyamides, polyesters, polyvinyl butyrals, polychloroprenes, SBR, acrylate rubbers, nitrile rubbers, silicone rubbers and the like. They are used either alone or in the form of a mixture of two kinds or more with optional addition of a solvent, tackifier, aging retarder, plasticizer, crosslinking agent, dispersion aid, pigment, organic or inorganic reinforcing or extending filler and the like.

The insulating adhesive resin is sheeted after compounding with the electrically conductive particles into a sheet- or film-like form having a desired thickness which is used as the inventive anisotropically electroconductive adhesive composition. The sheeting work to obtain the adhesive films can be performed by a known method using a calendering roller, doctor knife coater or gravure roller or by the screen printing method.

The conductive particle as the dispersed component of the anisotropically electroconductive adhesive composition of the invention should be amorphous carbon particles having a spherical particle configuration. The sphericity of the particles should be within 5 $\mu$m or, preferably, within 2 $\mu$m. Such a carbon powder of spherical particles is prepared by the calcination and carbonization of spherical particles of a heat-curable plastic resin. Examples of the heat-curable plastic resin used here include phenol-formaldehyde resins, amino resins such as melamine-formaldehyde resins and benzoguanamine-formaldehyde resins, unsaturated polyestes, epoxy resins, diallyl phthalate resins, polyurethanes and the like. They can be prepared in the form of spherical particles by any known methods including mechanical crushing of a cured mass obtained beforehand by crosslinking of the polymeric material to form balls and the method of the interface polymerization in which the reactant is agitated and dispersed in an immiscible liquid medium in the form of droplets by the surface tension followed by the polymerization to give spherical particles of a heat-curable plastic resin having a diameter of 50 $\mu$m or smaller. The spherical particles of the heat-curable plastic resin are then subjected to calcination and carbonization to be converted into amorphous carbon particles having a spherical particle configuration. The calcination should be carried out in an atmosphere of an inert gas such as nitrogen, argon and the like. The calcination temperature should preferably be in the range from 800° to 1200° C. or, more preferably, in the range from 900° to 1000° C. since graphitized carbon particles having a high degree of crystallinity but poor mechanical strength are produced by the calcination at an excessively high temperature of 2000° C. or higher. The length of time for the calcination should be set in consideration of the conditions of stirring and the amount of the heat-curable plastic resin filling the furnace and usually selected within the range from a few days to one week or, preferably, five days or shorter or, more preferably, 50 hours or shorter. A stepwise schedule is preferred in the increase and decrease of the temperature in performing the calcination.

The resin particles of the heat-curable plastic resin under calcination usually undergo a shrinkage of around 20% in diameter based on that of the starting particles of the resin. Therefore, it is important that the starting particles have a diameter about 1.2 times larger than that of the desired spherical particles after particle size classification by screening. The powder after the calcination should better be classified in respect of the particle diameter in consideration of possible secondary agglomeration after calcination.

The carbon particles thus obtained are amorphous and have a spherical particle configuration with an average particle diameter of 5 to 50 μm. The specific gravity thereof is in the range from 1.4 to 1.7 which is smaller than that of graphite having a specific gravity of 1.55 to 1.9. The coefficient of linear thermal expansion thereof is in the range from $2 \times 10^{-6}$ to $5 \times 10^{-6}/°C$.

The anisotorpically electroconductive adhesive composition of the invention is obtained by compounding the amorphous carbon particles having a spherical particle configuration with the insulating adhesive resin to be dispersed therein followed by sheeting by a known sheeting method. The compounding work of the amorpous carbon particles and the resin is performed by using a three-roller mill, homogenizer or a conventional mixing machine. The compounded amount of the carbon particles should be in the range from 0.1 to 30 parts by volume or, preferably, from 2 to 15 parts by volume per 100 parts by volume of the insulating adhesive resin. When the amount of the conductive particles is too large, the anisotropy in the electrical connection may eventually be destroyed due to the increase in the density of the particles within the plane leading to contacting of the adjacent particles as a matter of probability, especially, when the arrangement pitch of the terminal electrodes is so small as 0.6 mm or less. When the amount of the conductive particles is too small, on the other hand, it is a possible drawback that no conductive particle or particles are interposed between the electrodes to be electrically connected therewith leading to a decrease in the reliability of the electrical connection by an increase in the resistance or failure of connection.

The anisotropically electroconductive adhesive composition of the invention thus obtained is interposed between the terminal electrodes on two circuit boards followed by heating under a compressive force to simultaneously effect adhesive bonding of the circuit boards and electrical connection of the electrodes since the amorphous carbon particles having a spherical configuration contained in the anisotropically electroconductive adhesive composition serve to establish electrical connection only in the direction perpendicular to the plane of the adhesive film. Further, the outstandingly small linear themal expansion coefficient of the amorphous carbon particles has an effect of preventing forcible peeling of the once bonded electrodes unavoidable in conventional anisotropically electroconductive adhesive compositions as a result of thermal expansion of the adhesive film to cause failure in the adhesion between the surface of the electrode by a force exceeding the adhesive bonding strength and the adhesive film to be freed from the troubles of failure in the electrical connection or line disconnection in the circuit and to be imparted with advantages of stability in the resistance and adhesive bonding strength. In addition, the conductive adhesive composition of the invention has various advantages such as chemical stability of the carbon particles as the conductivity-imparting dispersed component, decreased settling of the particles in the resinous matrix and uniformity in the dispersion of the conductive particles in the resinous matrix owing to the small specific gravity of the conductive particles, good stability in the contacting conditions without the troubles of current leakage owing to the spherical configuration of the conductive particles and easiness of particle size control. Therefore, commercial production of the anisotropically electroconductive adhesive of the invention can be performed with a high productivity.

In the following, the adhesive composition of the invention is described in more detail by way of examples and comparative examples, in which the term of "parts" always refers to "parts by weight" unless otherwise mentioned.

EXAMPLE 1 AND COMPARATIVE EXAMPLES 1 TO 5

An anisotropically electroconductive adhesive composition was prepared by adding 4.8 parts by volume of amorphous carbon particles to 100 parts by volume of an insulating adhesive resin and uniformly dispersing the particles therein by using a homogenizer. The amorphous carbon particles were prepared by the calcination of particles of a phenol-formaldehyde resin having a spherical configuration at 900° C. for 3 days and had an average particle diameter of 33 μm, specific gravity of 1.47 and coefficient of linear thermal expansion of $3 \times 10^{-6}/°C$. The insulating adhesive resin was prepared from 100 parts of a styrene-butadiene-styrene block copolymer having a specific gravity of 0.94 and melt index of 6 with admixture of 60 parts of a terpene-phenol-based tackifier having a softening point of 145° C. and 220 parts of toluene. The specific gravity thereof was 0.97. The adhesive composition thus obtained was spread over a sheet of a polytetrafluoroethylene resin having a thickness of 50 μm using a bar coater to form a film having a thickness of 30 μm as dried which could be used as an anisotropically electroconductive adhesive film.

Then the adhesive film was interposed between two flexible circuit boards each prepared from a 25 μm thick polyimide film foiled with a gold-plated copper foil in 18 μm thickness, of which the conductive line width was 0.15 mm and the arrangement pitch of the conductive lines was 0.25 mm, and these circuit boards were bonded together by pressing on one side under a pressure of 20 kg/cm² with heating at 200° C. for 10 seconds using a heating tool having a silicone rubber-made cushioning pad at the head thereof. Measurements were conducted for the electric resistance between the electrodes bonded together and for the insulation between adjacent lines either as bonded and after 50 times repeated thermal shock tests between −40° C. and +80° C. to give the results shown in Table 1.

For comparison, electrically conductive adhesive compositions were prepared each in the same formulation as above excepting replacement of the conductive powder of amorphous spherical carbon particles used above with the same volume of a nickel powder having a specific gravity of 8.85 and a coefficient of linear thermal expansion of $1.33 \times 10^{-5}/°C$. (Comparative Example 1), gold-plated spherical epoxy resin particles having a specific gravity of 1.9 and a coefficient of linear thermal expansion of $4.5 \times 10^{-5}/°C$. (Comparative Example 2), silicon carbide particles of irregular particle configuration having a specific gravity of 3.1 and a coefficient of linear thermal expansion of $4.8 \times 10^{-6}/°C$. (Comparative Example 3), extremely fine chopped carbon fibers having a specific gravity of 1.78 and a coefficient of linear thermal expansion of $5 \times 10^{-6}/°C$. (Comparative Example 4) or graphite particles of a granular or flaky particle configuration having a specific gravity of 1.75 and a coefficient of linear thermal expansion of $4 \times 10^{-6}/°C$. (Comparative Example 5) as the electrically conductive dispersed material. These conductive particles were subjected to screening before compounding with the resin using two sieves having a mesh opening of 26 μm and 37 μm. Conductive adhesive films were prepared in a similar process to that in Example 1 and measurements of the resistance were undertaken also in the same manner as in Example 1 to give the results shown in Table 1.

EXAMPLE 2 AND COMPARATIVE EXAMPLES 6 TO 10

An anisotropically electroconductive adhesive film was prepared in substantially the same manner as in Example 1 from an insulating adhesive prepared by blending 50 parts of a polychloroprene-based adhesive containing 30 % by weight of solid in a solvent mixture of toluene and methyl ethyl ketone, 75 parts of a thermoplastic polyester resin having an average molecular weight of about 20,000 and a melting point of 137° C. and 200 parts of toluene with either one kind of the same electrconductive powders as used in Example 1 and Comparative Examples 1 to 5. The thus prepared anisotropically electroconductive adhesive film was interposed between a 25 μm thick polyester film provided with a pattern of conductive line electrodes of silver-carbon in a line width of 0.2 mm and at a pitch of 0.4 mm by screen printing and a 1.12 mm thick glass plate-based transparent electrode provided with a conductive coating film of indium oxide having a resistance of 30 ohm/square in the same line pattern as on the polyester film. The polyester film and the transparent electrode were bonded together by pressing for 5 seconds at 200° C. under a pressure of 30 kg/cm² and subjected to the measurement of the electric resistance between the line electrode on the polyester film and the indium oxide electrode and insulation between the conductive lines as prepared and also to the measurement of the resistance after aging for 100 hours at 60° C. in an atmosphere of 95% relative humidity under passing of an electric current of 10 mA per one pair of electrodes. The results are shown in Table 2.

TABLE 1

| Example No. | Conductive particles | Initial resistance, ohm | Initial insulation resistance, ohm | Resistance after high humidity test, ohm |
| --- | --- | --- | --- | --- |
| Example 1 | spherical amorphous carbon particles | 3.5 | 10¹⁰ | 3.6 |
| Comparative Example 1 | nickel powder* | 11.2 | 10¹⁰ | 58.0 |
| Comparative Example 2 | gold-plated epoxy resin | 8.2 | leak | 18.0 |
| Comparative Example 3 | silicon carbide powder | 10.5 | 10¹⁰ | 45.0 |
| Comparative Example 4 | carbon staples | 35.7 | leak | 10.3 |
| Comparative Example 5 | graphite powder | 4.7 | 10⁴ | 4.75 |

*poor dispersion with initial resistance of 183 ohm though without noticeable leakage

TABLE 2

| Example No. | Conductive particles | Initial resistance, ohm | Initial insulation resistance, ohm | Resistance after high humidity test, ohm |
| --- | --- | --- | --- | --- |
| Example 2 | spherical amorphous carbon particles | 910 | 10¹⁰ | 920 |
| Comparative Example 6 | nickel powder | 902 | 10¹⁰ | 1,346 |
| Comparative Example 7 | gold-plated epoxy resin | 915 | 1010 | — |
| Comparative Example 8 | silicon carbide powder | 973 | 10¹⁰ | — |
| Comparative Example 9 | carbon staples | 1,381 | leak | 1,575 |
| Comparative Example 10 | graphite powder | 1,123 | 10⁵ | 1,208 |

What is claimed is:

1. An anisotropically electroconductive adhesive composition comprising a uniform blend of:
    (a) a matrix of an electrically insulating adhesive resin having a specific gravity of at least 0.8 prior to solidification or curing; and
    (b) amorphous carbon particles dispersed in the matrix, said particles having a spherical particle configuration with a sphericity not exceeding 5 μm, an average particle diameter in the range from 5 to 50 μm, a specific gravity in the range form 1.4 to 1.7, and a coefficient of linear thermal expansion in the range from $2 \times 10^{-6}$ to $5 \times 10^6/°C$., said particles being prepared by calcination and carbonization of spherical particles of a heat curable plastic resin, the carbon particles being present in an amount in the range from 0.1 parts to 30 parts by volume per 100 parts by volume of the insulating adhesive resin.

2. The anisotropically electroconductive adhesive composition as claimed in claim 1 in which the heat-curable plastic resin is selected from the group consisting of phenol-formaldehyde resins, amino resins, unsaturated polyesters, epoxy resins, diallyl phthalate resins and polyurethanes.

3. The anisotropically electroconductive adhesive composition as claimed in claim 1 in which the calcination is performed at a temperature in the range from 800° C. to 1200° C.

4. The anisotropically electroconductive adhesive composition as claimed in claim 3 in which the calcination is performed at a temperature in the range from 900° C. to 1000° C.

5. The anisotropically electroconductive adhesive composition as claimed in claim 1 in which the amorphous carbon particles having a spherical particle configuration are compounded with the insulating adhesive resin in an amount in the range from 2 parts by volume to 15 parts by volume per 100 parts by volume of the insulating adhesive resin.

6. The anisotropically electroconductive adhesive composition as claimed in claim 1 in which the amorphous carbon particles having a spherical particle configuration have a sphericity not exceeding 2 μm.

* * * * *